United States Patent [19]
Kelzer

[11] Patent Number: 5,617,989
[45] Date of Patent: Apr. 8, 1997

[54] SOLDER LEVELING APPARATUS AND METHOD

[76] Inventor: Robert A. Kelzer, 2283 E. Pinetree Blvd., Thomasville, Ga. 31792

[21] Appl. No.: 506,789

[22] Filed: Jul. 25, 1995

[51] Int. Cl.$^6$ .............................. H05K 3/34; B23K 3/08; B23K 1/00

[52] U.S. Cl. .................. 228/125; 228/20.1; 228/254; 118/106; 427/349

[58] Field of Search ............................ 228/19, 20.1, 125, 228/254; 118/56, 63, 106; 427/96, 348, 349

[56] References Cited

U.S. PATENT DOCUMENTS

| | | | |
|---|---|---|---|
| 3,973,893 | 8/1976 | Camp, III | 425/324.1 |
| 3,992,135 | 11/1976 | Camp, III | 425/174.2 |
| 4,025,272 | 5/1977 | Camp, III | 425/324.1 |
| 4,752,027 | 6/1988 | Gschwend | 228/180.22 |
| 5,167,361 | 12/1992 | Liebman et al. | 228/254 |
| 5,172,853 | 12/1992 | Maiwald | 228/248.1 |
| 5,226,964 | 7/1993 | Meuche | 118/424 |
| 5,480,483 | 1/1996 | Velie | 118/45 |

*Primary Examiner*—Samuel M. Heinrich
*Attorney, Agent, or Firm*—Brian D. Bellamy

[57] ABSTRACT

Embodiments of a new apparatus for leveling solder contacts on printed circuit board panels are disclosed. A fluid is received by a platen and dispersed against a belt that engages the panel. A surface of the platen causes the pressure of the fluid to automatically adjust to the area of the panel by providing a series of parallel channels or holes in the surface.

8 Claims, 7 Drawing Sheets

SOLDER LEVELING APPARATUS AND METHOD

BACKGROUND OF THE INVENTION

This invention relates to leveling irregular solder mounds on printed circuit boards and more particularly to an air dispersion platen apparatus used in a process for continuous manufacture and leveling of irregularly shaped solder contacts on electronic circuit board panels.

Typically, electronic circuit board panels are produced with multiple solder contacts for mounting multi-lead integrated circuit packages on the circuit board. In producing a printed circuit board panel with solder contacts, a 0.004 inches thick film referred to as a "solder mask" is applied to the panel. The "solder mask" is exposed and developed to produce a cavity at each position of a solder pad. Commonly, a solder paste is then squeegeed onto the panel to fill the cavities. Then, the circuit board panel is heated to cause the solder paste to fuse into solid solder. This fusing process causes the solder to ball up into irregular mounds of solder.

As long as the solder mounds remain irregular, multi-lead integrated circuit packages cannot be effectively soldered to the circuit board panel. For the integrated circuit packages to effectively solder to the circuit board using known soldering processes, the solder contacts must be flat. Flat solder contacts permit the leads on integrated circuit packages to rest in contact with the solder contacts of the printed circuit board. Therefore, when the integrated circuit package is placed on the circuit board and soldered using any one of several known techniques, the package and the circuit board will have a solid solder bond. However, producing circuit board panels with flat solder contacts has been inherently problematic because of the solder contacts proximity to each other and their microscopic size.

Conventionally, the process of flattening and leveling irregular solder mounds on printed circuit board panels has been accomplished by heating the solder until it is molten and then applying direct mechanical pressure by way of platens to Teflon coated belts that press against the circuit board panels. Usually, the belts pass between a stationary platen and a spring loaded platen. Wherein, the platens physically press against the belts toward the printed circuit, pushing the molten solder into the cavities of the solder pads as the solder cools. By the conventional leveling process, the mechanical pressure required to effect proper flattening of the solder contacts is 200 to 400 pounds of total force. Applying this amount of force causes excess friction between the belts and the platens, making it difficult to pull the belts thru the platens. The result is increased heat from friction and increased wear on the belts, shortening the belts' durabilities.

Another problem with the conventional system is that the platens are flat, but the typical circuit board panel is not. A circuit board panel can vary in thickness from side to side and end to end by as much as 0.010 inches. The force of the direct mechanical pressure applied by the platens is concentrated at the thicker areas of the circuit board panel. These uneven concentrations of force increase stress on portions of the belts and shorten the lives of the belts.

The uneven pressures on the panel because of its variable thickness can also cause soldering problems. To achieve reliable soldering, all leads must contact or come within 0.001 inches of the solder pad. Consequently, to produce reliable circuit boards using the present process, only narrow boards with less variances in thickness can be processed.

Another apparatus for flattening solder contacts on circuit boards uses self-contained hydraulic bladders. A shuttle type conveyor transports a printed circuit board between the hydraulic bladders, and the bladders are expanded to press against the circuit board toward the printed circuit and level the irregular solder mounds. A primary drawback to this apparatus is that it requires batch processing of boards, rather than continuous processing. Because it interrupts the flow of work, batch processing is an inherently less efficient means of leveling irregular solder contacts in the production of printed circuit board panels than continuous processing.

A method and apparatus for flattening solder bumps using roller machines is disclosed in U.S. Pat. No. 4,752,027 issued to S. J. Gschwend on Jun. 21, 1988. Solder bumps are reflowed and then cleaned to form discrete solder bumps. Using roller machines, the peaks of the solder bumps are flattened. This method, however, is not continuous and, as a result would be time consuming and likely ineffective for printed circuit boards of modern scale.

As to the application of solder to printed wiring boards, a method for applying solder to printed wiring boards is disclosed in U.S. Pat. No. 5,172,853. The method includes producing a printed wiring board with electrically conductive regions, depositing solder paste on the electrically conductive regions, melting the solder deposits to form hump-shaped solder applications on the printed wiring board, leveling the hump-shaped solder applications by applying pressure to the solder applications in the direction of the printed wiring board, and reinforcing the leveling of the hump-shaped solder applications by heating the applied solder. A related process is described above by way of introducing the subject matter of the invention.

In a field of art substantially unrelated to the invention, Stafford Camp disclosed an apparatus for continuously manufacturing particle boards in U.S. Pat. No. 4,025,272, issued May 24, 1977. In the Camp patent, compressed particle board mats are conveyed by a pair of endless belts between a pair of spaced platens. The spaced platens disclosed include a means for distributing fluid under pressure against the belts. The pressure distributing means includes a plurality of individual subcompartments in each platen. Each subcompartment is supplied with a regulator means for independently controlling the pressure of fluid supplied to each subcompartment. The pressure distributed by the platens causes fluid bearings between the platens and the belts and causes the mat to be dimensioned to is final size by controlling the thickness of the mat. The Camp patent does not suggest the use of air distributing platens in producing printed circuit board panels or flattening solder contacts, but teaches the use of platens having conduits and self-contained chambers in continuously manufacturing board from a mixture of board particles and a bonding agent.

Accordingly, one object of the present invention is to provide a process of producing printed circuit board panels having planar solder contacts while obviating one or more of the limitations and disadvantages of the described prior systems;

Another object of the present invention is to provide an apparatus for producing planar solder contacts on electronic circuit board panels that obviates the disadvantages of know methods;

Another object of the present invention is to decrease the amount of stress on belts during the solder leveling process;

Another object of the present invention is to provide a solder leveling apparatus that reduces uneven concentrations of force by accounting for the varying thicknesses of circuit board panels;

Another object of the present invention is to improve solder leveling on wider circuit board panels.

Yet, another object of the present invention is to improve the quality of the solder joints produced between multi-lead integrated circuit packages and printed circuit board panels.

These and other objects of the invention will be apparent to those persons skilled in this art from the following detailed description of a preferred embodiment of the invention.

SUMMARY OF THE INVENTION

The solder leveling apparatus and process of the present invention provides improved leveling of solder contacts on printed circuit board panels using an air dispersion platen arrangement. The solder on the panel is heated to a molten state and the panel is carried by a belt between a pair of spaced platens. A dispersing means associated with at least one of the platens receives a fluid under pressure and disperses the fluid against the adjacent belt. A surface of the platens disperses the pressure of the fluid in incremental widths according to the width of the associated panel. The fluid pressure causes the belt to press against the panel and flatten the molten solder deposits into a level plane.

DETAILED DESCRIPTION OF THE INVENTION

Figure 1:
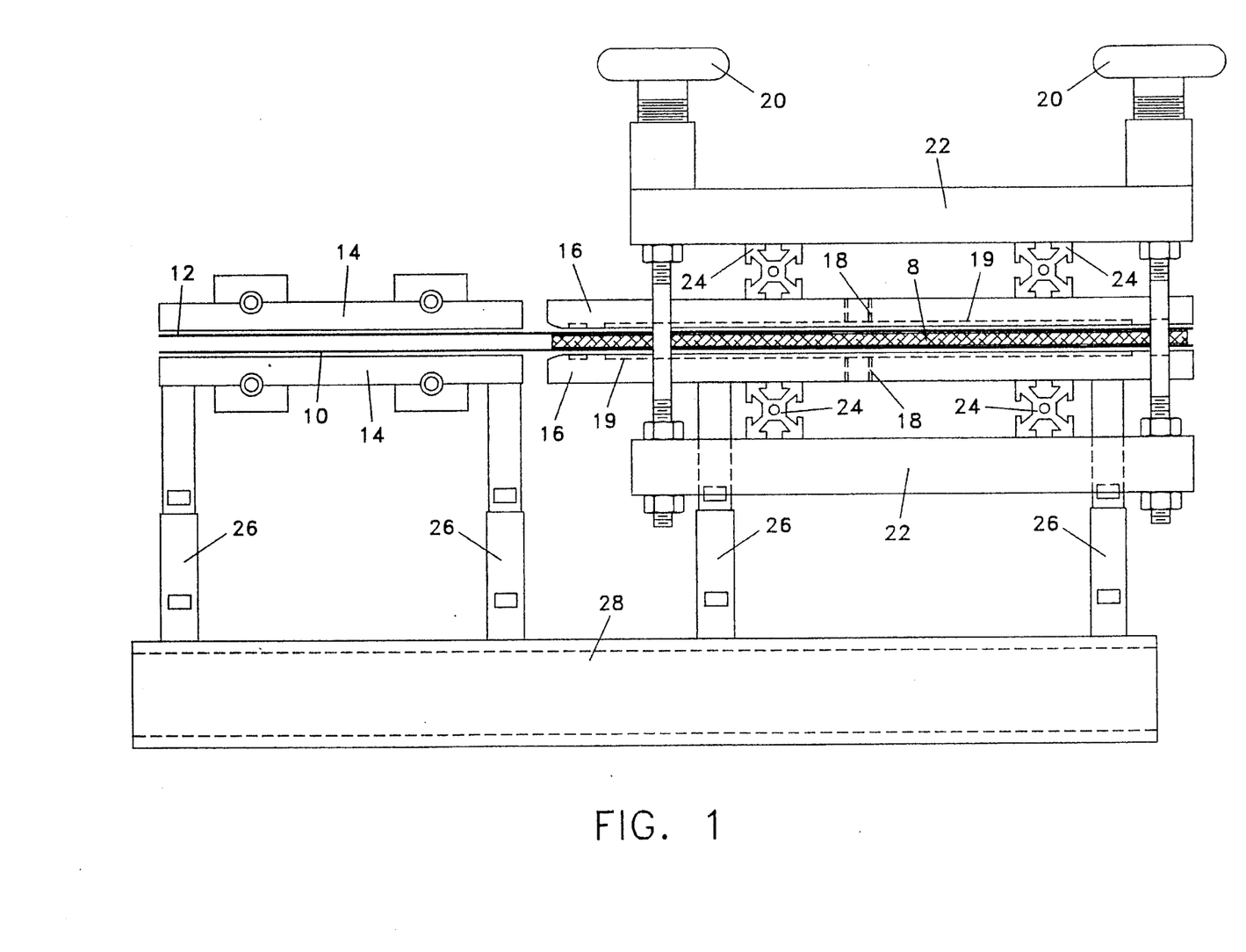
FIG. 1 is a side view of a solder leveling apparatus constructed in accordance with the teachings of the present invention.

Referring to the drawings, FIG. 1 illustrates the general arrangement of components utilized by a preferred embodiment of the present invention in flattening and leveling solder contacts on electronic circuit board panels. An printed electronic circuit board panel indicated by the numeral 8 is carried by a continuous lower belt 10 that traverses in a parallel and facing relationship to a continuous upper belt 12. FIG. 1 depicts the panel moving through the apparatus from left to right. The panel is carried through a means for heating the solder paste to cause it to re-melt and become fluid. Conventionally, the heating means comprises a pair of heating platens 14 facingly positioned. After heating the solder to a molten state, the panel customarily would be carried through a second pair of platens that are mechanically pressed against the belts to level the molten solder contacts.

The present invention eliminates the problems associated with mechanically directed platens by using a pair of air apportioning platens 16. In the present leveling process, the panel 8 is carried by the belts 10 and 12 through the before mentioned heating process and then through a novel solder flattening apparatus comprising one or more air dispersion platens 16. Various embodiments of the air dispersion platens will be described below with reference to the drawings. It is advantageous for a pair of these air dispersion platens to be facingly positioned, with each including a means for receiving and dispersing a gaseous fluid in equal amounts against the circuit board panel from a suitable supply. Usually, the supply should provide a common gas such as air.

In the FIG. 1 embodiment, the fluid is received through inlets 18 in the center of each platen. The supply provides enough fluid to introduce the fluid to the belts at about 3 to 5 pounds of pressure per square inch. A special surface of each platen faces the belts and is referred to herein as an dispersing surface 19. The dispersing surfaces of the platens distribute the fluid against the belts and force the belts to press flatly against the circuit board panel. The pressure of the air in combination with the dispersing action of the platens causes the belts to seal about the circuit board and adjust to varying circuit board panel widths. By the pressure of the air, the belts effectively bring about 3 to 5 pounds of pressure per square inch to bear on the molten solder without the platens physically contacting the belts. The belts force the molten solder into the cavities of the panel and hold the solder flush while it cools, causing the solder balls to be flattened to equal height within about 0.001 inches after the solder freezes. Although the preferred apparatus uses two facingly opposed platens, alternative arrangements could accomplish the desired results, including using a standard lower platen in combination with an upper air dispersion platen.

Figure 2:
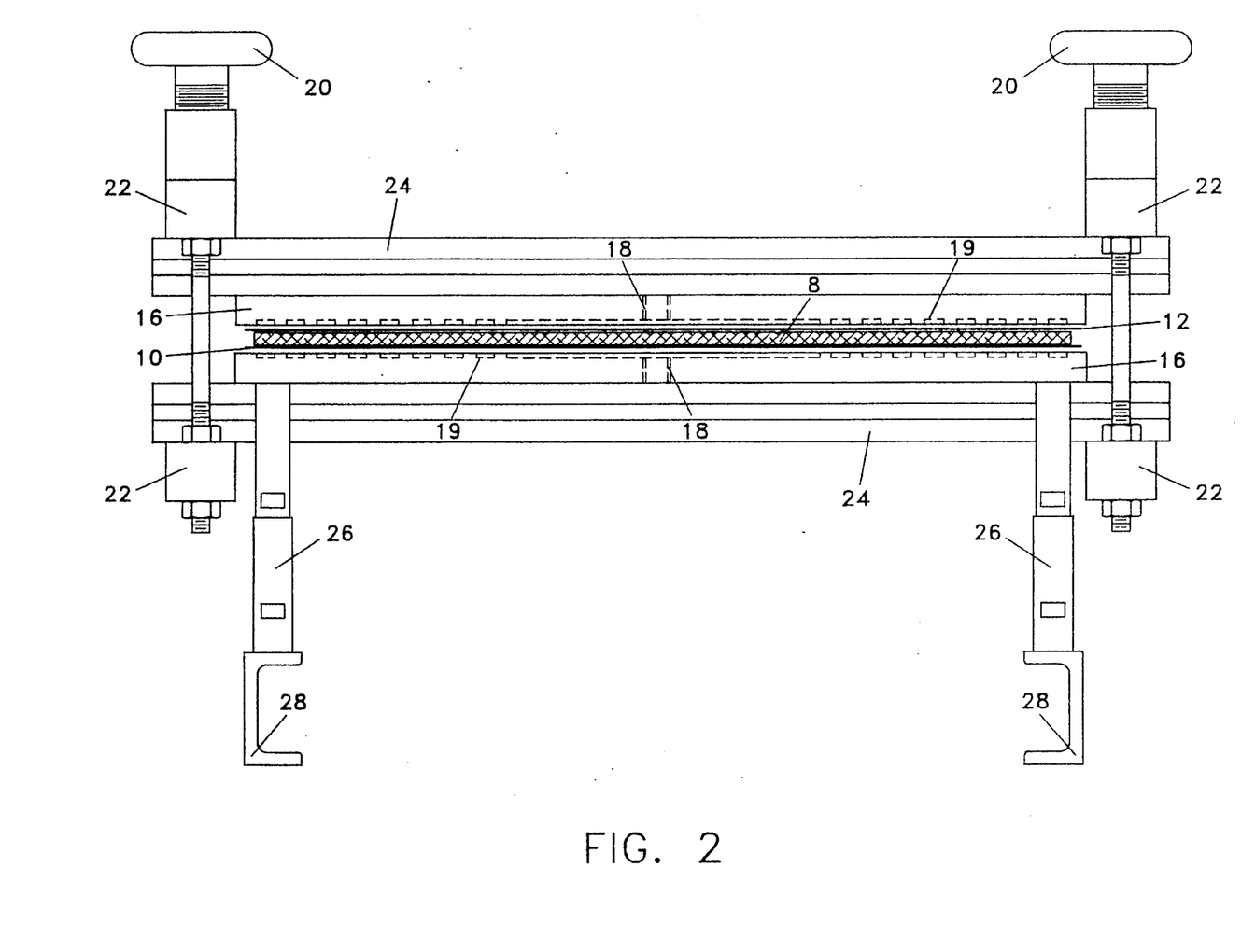
FIG. 2 is a fragmentary end view of the solder leveling apparatus shown in FIG. 1 showing in more detail a platen arrangement in an adjacent relationship to a printed circuit board panel.

The fragmentary end view of FIG. 2 renders a more descriptive view of the air dispersion platen arrangement. To function properly a suitable margin should exist between the platens, the belts, and the circuit board to allow the fluid to flow between them. Using a suitable means for adjusting the clearance between the belts such as an adjusting dial 20, the proper spacing between components can be set. For instance, the belts should be set in an appropriate spacial relationship with each other, while accounting for the thickness of the printed circuit board panel.

Various embodiments could be created to maintain the present invention's preferred air dispersion platen arrangement. However, as shown in FIG. 2, one embodiment includes several structural beams 22 that form the outer frame of the platen arrangement and house portions of the adjusting dials 20. To provide the proper degree of precision in leveling solder contacts the platens must remain completely flat. To prevent flexion in the platens, a plurality of stiffening braces 24 may be fixed across the platens as one of many available means to provide additional support.

Several adjustable level supports 26 are connected between the platen assemblies and a pair of mounting rails 28. Although, customary mounting rails are shown in FIG. 2, the apparatus could include any satisfactory means for mounting the apparatus onto a supporting structure and adjusting the level of the apparatus.

The belts 10 and 12 used in the present invention must be flat and durable, as well as have significant lubricity. The preferred belts are formed of fiberglass and coated with Teflon, though the required belt characteristics may be achieved by other means by those skilled in the art. It is well known in the art that Teflon is a suitable material for the belts because the Teflon coating does not adhere to the molten solder and gives the belts the required lubricity. Furthermore, Teflon provides a smooth coating over the coarse fiberglass belts that gives the belts the required smoothness for leveling microscopic solder mounds.

Figure 3:
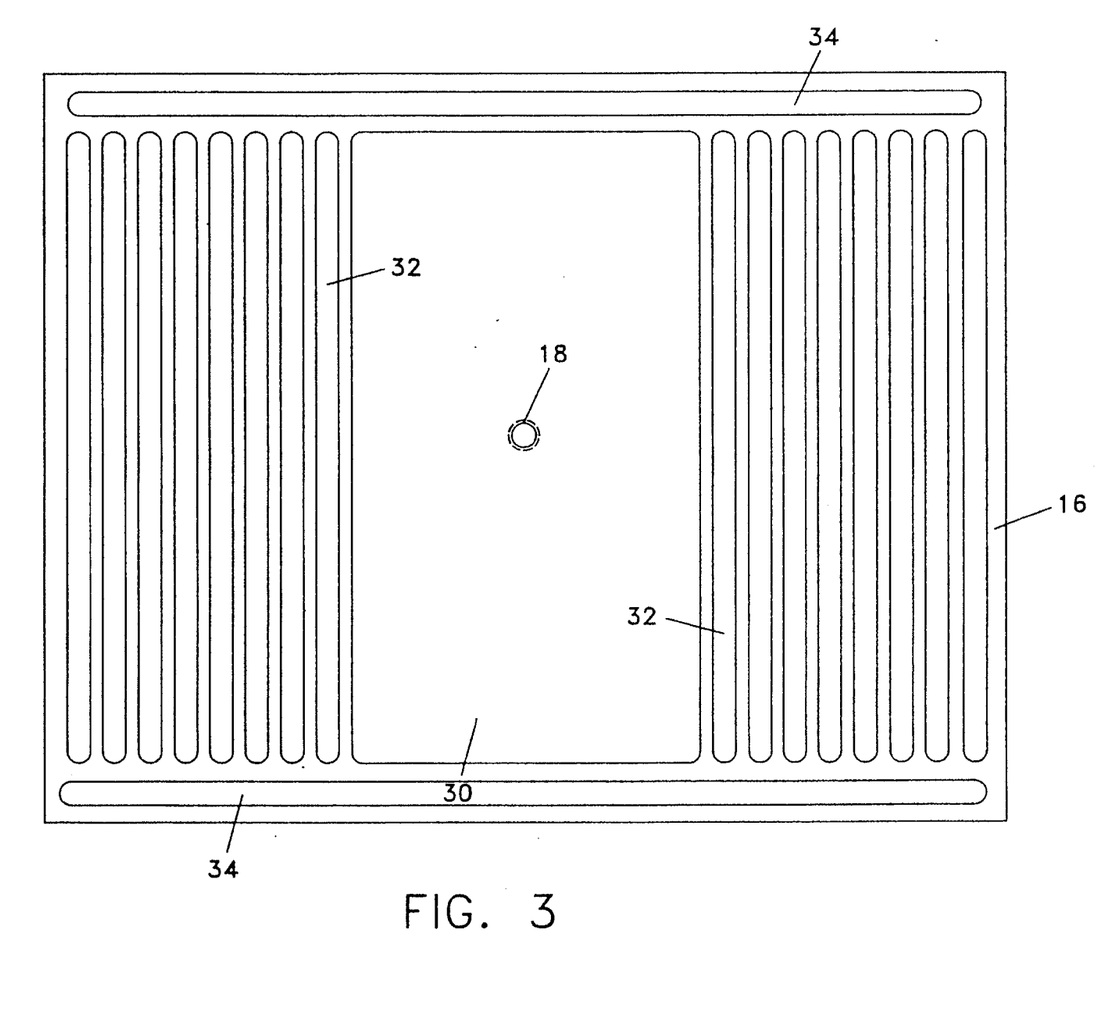
FIG. 3 is a plan view of a surface of an air dispersion platen that faces toward the adjacent printed circuit board panel of FIG. 2.

FIG. 3 shows the preferred platen 16 for dispersing air against the upper and lower belts 10 and 12. A suitable material is used for the platens that conforms with environmental requirements. One such environmental requirement is that the materials used in the construction of electronic circuit boards cannot include any silicon. Variations of the following described platen designs that will satisfy many of the objectives of the present invention will be evident to those skilled in the art.

The platen shown in FIG. 3 has the inlet 18 in its center whereby air or some other fluid is received. The inlet permits the air to enter a center air cell 30 in the center of the platen. Typically, this center air cell will be about ⅛ inches in depth. The size of the center air cell is such that it can be used for working with narrower printed circuit board panels. Additionally, a plurality of parallel channels 32 are equally spaced outward from the center air cell and are positioned parallel to the travel direction of the belts. These channels will usually be several times greater in length than width.

The fluid provided through the inlet 18 flows between each platen and its adjacent belt. As panels are moved by the belts through the platens, the channels 32 permit the supplied air pressure to be dispersed according to the size of the panel. To create a wider active flattening area and seal the adjacent belt against a wider panel, air pockets distributing equal amounts of air pressure form in the narrow channels relative to the width of the panel. When wider panels are moved through the platens, more channels become operational and seal, increasing the effective flattening area of the platens. The sealed channels cause the belt to press against the printed circuit board panel causing the belt to flatten the irregular solder mounds. After the fluid crosses all of the sealed channels, it escapes into the atmosphere. The sealing action of the channels produces an automatic sizing means to accommodate panels of varying sizes through the apparatus. Without the incremental automatic sizing operation of the channels, the surface pressures on the platens could not be controlled, and the fluid would escape to the atmosphere without confining the fluid's pressure to the panels.

At least one pair of long narrow perpendicular channels 34 are positioned at the outer edges of the platens with their lengths perpendicular to the direction of belt travel. These perpendicular channels collect spill-over air and disperse it along the belt for stability.

Figure 4:
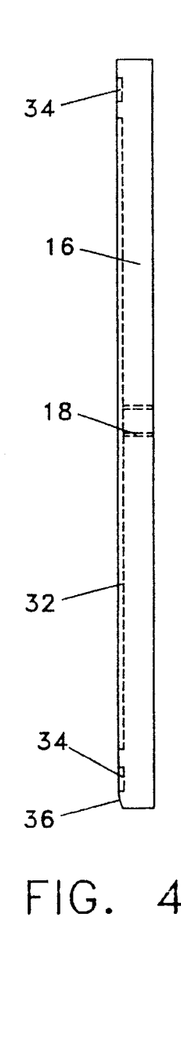
FIG. 4 is an end view of the platen shown in FIG. 3.

FIG. 4 is an end view of the air dispersion platen shown in FIG. 3 that shows the position of the inlet 18. The preferred platen further includes chamfered edges 36 to prevent the platens from chafing the belts during operation and inducing premature wear.

Figure 5:
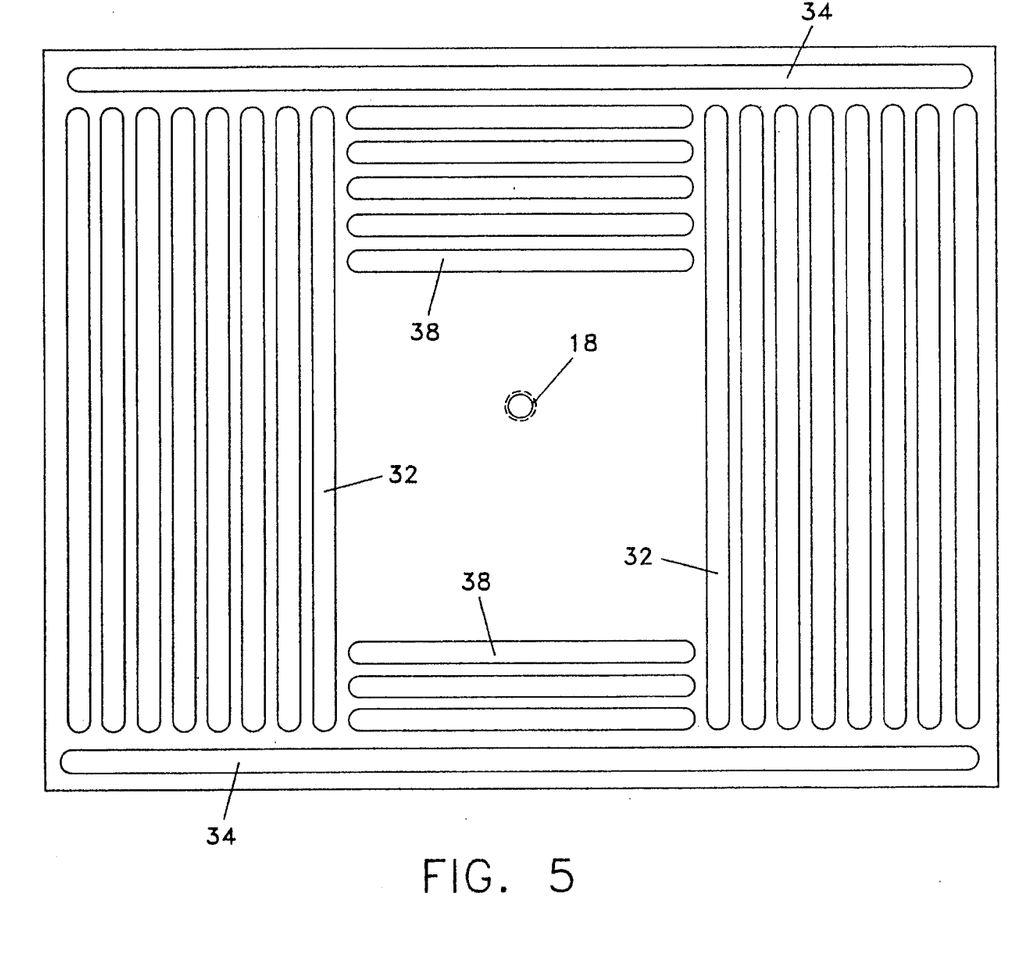
FIG. 5 is a plan view of a surface of an alternative embodiment of an air dispersion platen like that shown in FIG. 3.

FIG. 5 shows a platen similar to that of FIG. 3, but having additional perpendicular channels 38 perpendicular to the direction of belt travel. These additional perpendicular channels collect spill-over air and disperse it along the belt for stability in the same manner as the channels 34. However, the additional channels 38 function as an additional sizing means to accommodate panels of varying sizes through the apparatus. Thus, the platen shown in FIG. 5 uses the additional perpendicular channels 38 to increase stability for narrower panels.

Figures 6, 7:
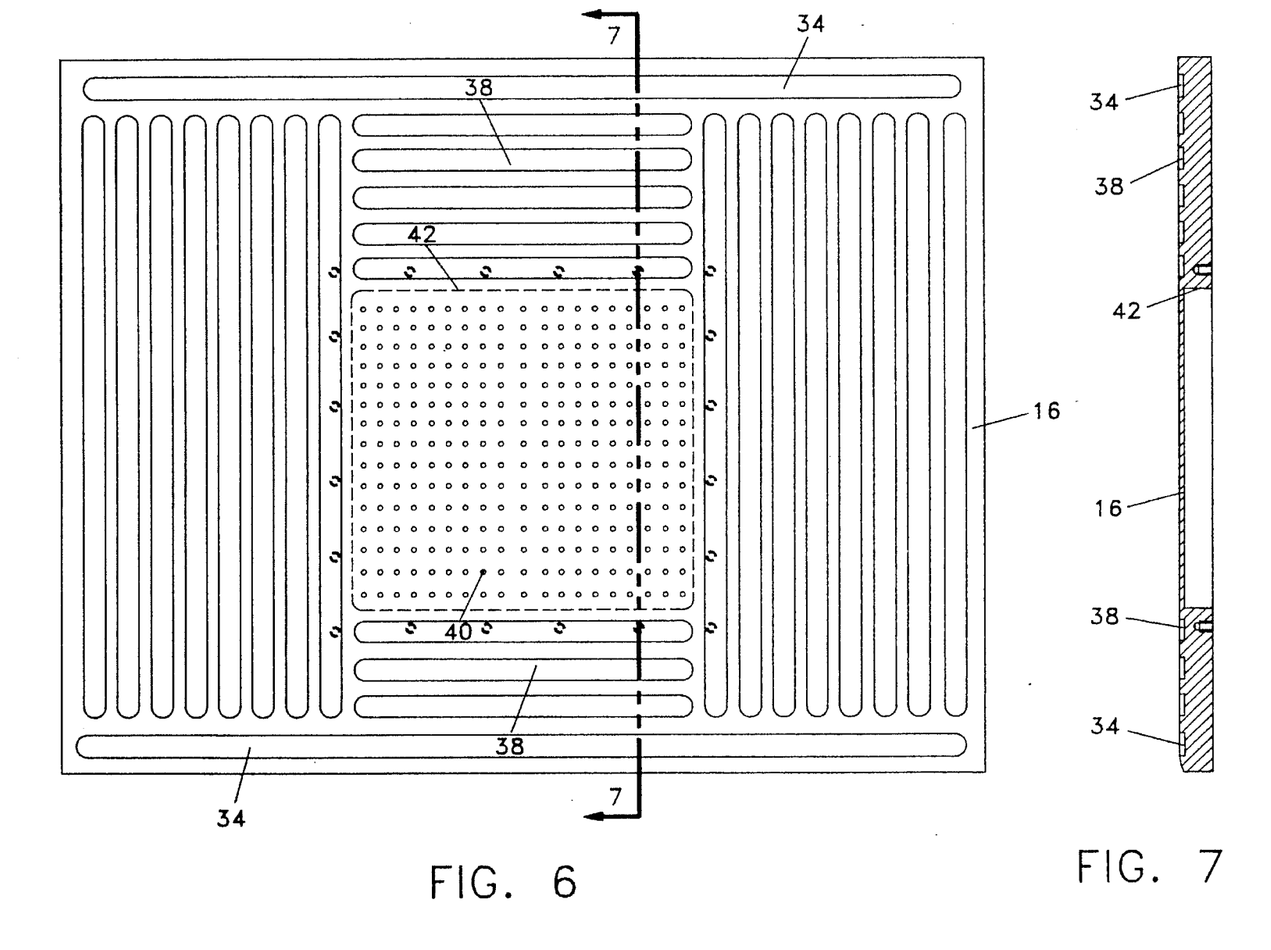
FIG. 6 is a plan view of a surface of a second alternative embodiment of an air dispersion platen.
FIG. 7 is an end view of the platen shown in FIG. 6.

A significant variation of the original platen shown in FIG. 3 is shown in FIGS. 6 and 7. FIG. 6 shows an addition of a plurality of holes 40 through a centrally located area of the platen. Preferably, the plurality of holes will form a uniform pattern of horizontally and vertically aligned holes on the platen face, and the diameter of these holes will be about that of a pin-head or less than two millimeters. However, the pattern and size of the holes could be varied by one skilled in the art according to use.

Figure 8:
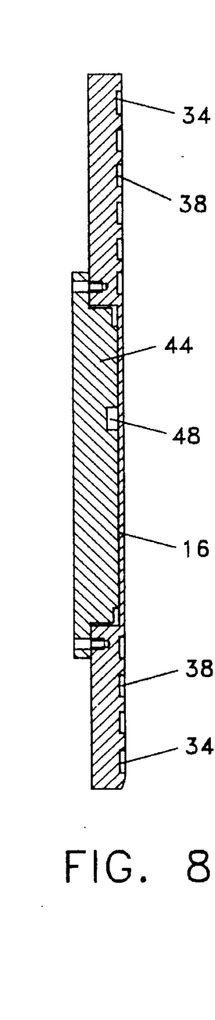
FIG. 8 is a end view of an alternative platen arrangement including an additional platen insert.
Figure 9:
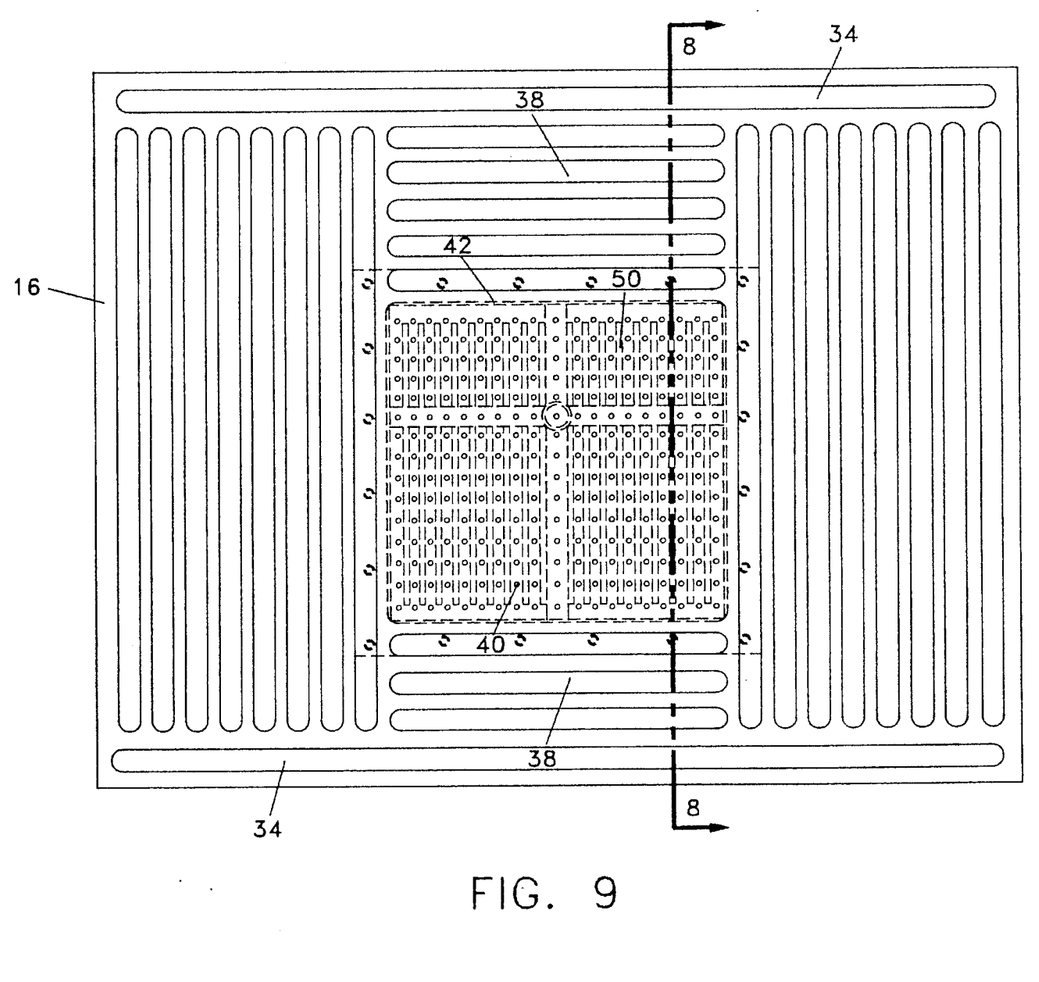
FIG. 9 is a plan view including hidden lines of the platen arrangement shown in FIG. 8 and shows a surface of an alternative embodiment of an air dispersion platen that faces toward the adjacent printed circuit board panel in the platen arrangement of FIG. 2 and has additional air dispersing characteristics.
Figure 10:
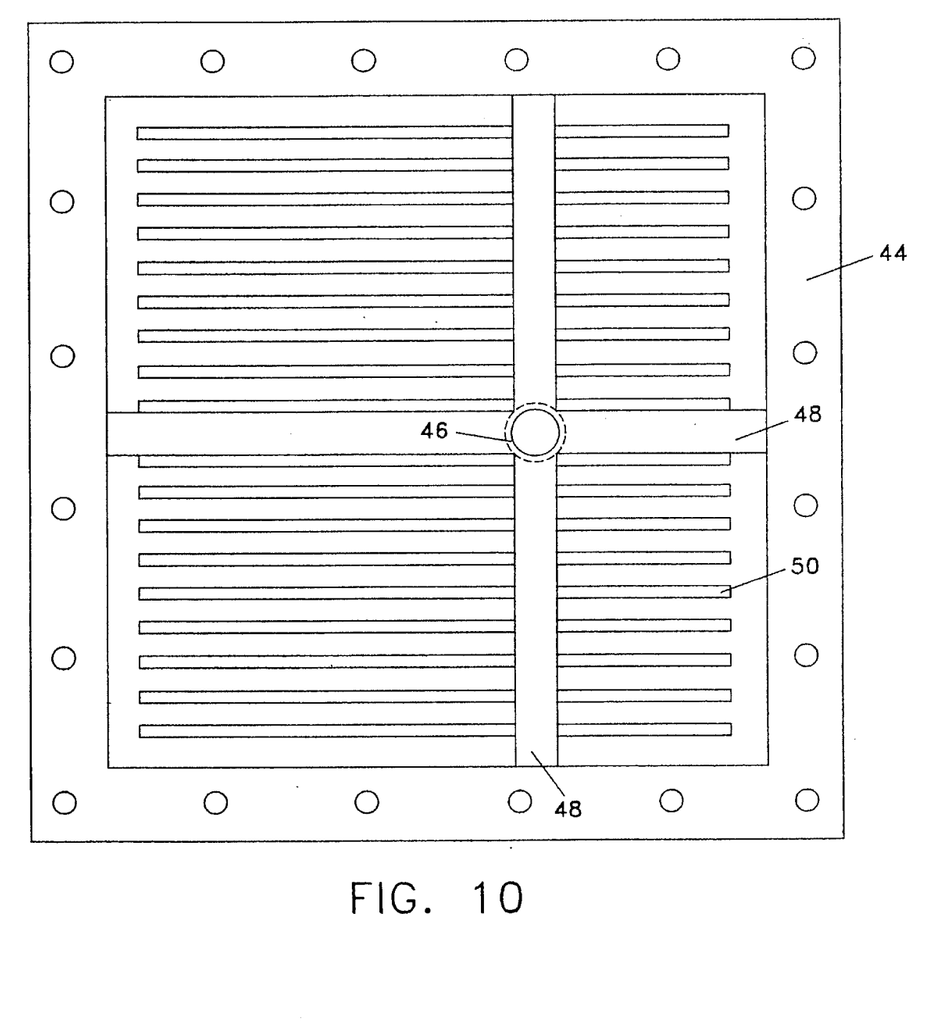
FIG. 10 is a plan view of a surface of a distribution plate that faces toward the adjacent printed circuit board panel in the platen arrangement of FIG. 2.
Figure 11:
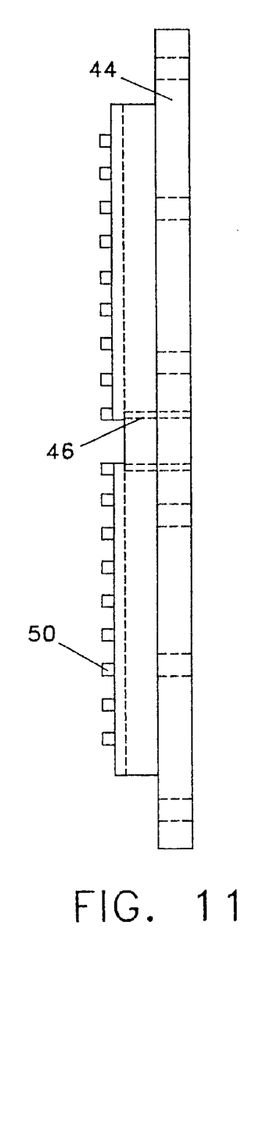
FIG. 11 is an end view of the distribution plate shown in FIG. 10.

In the embodiment of FIG. 6, a portion of the platen's width about its central area is cut away to permit the insertion of an additional part. The sectional view FIG. 7 taken along line 7—7 of FIG. 6 shows in more detail where the shape of the platen is modified to exclude a portion thereof, resulting in an indentation 42. As shown in the fragmentary view of FIG. 8, a distribution plate 44 fits securely into the indentation. Combined, the distribution plate and platen have an arrangement for dispersing the fluid as shown in FIG. 9. A preferred embodiment of the distribution plate is shown by FIGS. 10 and 11. The fluid enters the platens thru the inlet 46 and is distributed by at least one distribution channel 48 through a plurality partitions formed by flanges 50. The flanges, which usually are parallel, act to disperse the fluid. The fluid is then discharged through the holes 40. The holes 40 replace the inlet 18 of the first described platen for receiving and discharging the fluid through the platen. Using the distribution plate in combination with the plurality of holes is advantageous because it eliminates any size limitations for operating on smaller circuit board panels. For a smaller circuit board panel, a portion of the hole pattern will be covered by the panel and become operational in causing a seal around the panel, similar to the operation of the channels 32 for larger panels.

The present invention offers several distant advantages for manufacturing printed electronic circuit board panels having flattened solder bumps. For instance, an automatically adjusting air pocket width adjusts for panel widths, whereby sizes of panels may vary from less than 9 inches to more than 20 inches wide. Because the panel is used by the belts as a reference surface, the air pressure against the belts is uniform and the belts press flushly against every part of the panel. Despite variations in the thickness of panels by up to 0.010 inches, the air pressure dispersed by the platens causes the belts to press flatly against the panels according to the dimensions of the panels rather than the platens. Finally, a thin layer of air pressure forms between the platens and the belts such that the platens do not actually physically contact the belts. Thus, by reducing friction the amount of wear on the belts is significantly reduced, resulting in a more durable machine and more dependable process.

I claim:

1. A solder leveling apparatus comprising:
   a means for heating solder deposits on a printed circuit board panel into a molten state;
   a pair of spaced platens;
   a pair of belts that are facingly positioned for engaging surfaces of a printed circuit board panel and carrying the circuit board panel between the platens;

a means associated with the platens for dispersing fluid under pressure in incremental widths against at least one of the belts thereby causing the belt to press against the panel and flatten the molten solder deposits into a level plane while permitting surplus fluid to escape into the atmosphere, said dispersing means including:

a. means for supplying a fluid under pressure;

b. an inlet means for receiving the fluid; and c. a surface of the platens facing the belt which disperses the fluid under pressure in incremental widths;

whereby the pressure provided by the fluid against the belt automatically adjusts according to the size of the panel to seal the belt against the panel while the solder deposits are flattened.

2. A solder leveling apparatus as set forth in claim 1 wherein said dispersing means further includes:

a center cell about ⅛ inch in depth in said dispersing surface;

a plurality of channels in said surface with lengths greater than their widths and which are spaced outward from the center cell in a lengthwise direction parallel to the travel direction of said belts; and at least two channels in said surface with lengths greater than their widths which are spaced outward from the center cell in a lengthwise direction perpendicular to the travel direction of said belts.

3. A solder leveling apparatus as set forth in claim 2 wherein said surface of said dispersing means includes a plurality of channels with lengths greater than their widths which are spaced outward from the center cell in a lengthwise direction perpendicular to the travel direction of said belts.

4. A solder leveling apparatus as set forth in claim 1 wherein said dispersing means further includes:

a center area in said dispersing surface;

a plurality of holes located within said center area through which said fluid passes;

an indention on the opposite surface from said dispersing surface that is at least as large as the center area; and a distribution plate received by the indention for distributing said fluid uniformly through the holes in the center area.

5. A solder leveling apparatus as set forth in claim 4 wherein said distribution plate further includes:

a plurality of flanges forming partitioned areas thereon and at least one distribution channel for distributing said fluid to each of the partitioned areas.

6. A solder leveling apparatus as set forth in claim 4 wherein said holes have a diameter of less than 2 millimeters.

7. A solder leveling apparatus as set forth in claim 4 wherein said holes form a uniform pattern on said center area.

8. A method of leveling solder contacts on printed electronic circuit board panels comprising the steps of:

a. heating solder deposits on a printed circuit board panel into a molten state;

b. carrying the circuit board panel between a pair of air dispersion platens by a pair of belts;

c. supplying a fluid under pressure to the air dispersion platens;

d. receiving the fluid through an inlet in the air dispersion platens; and e. dispersing the fluid equally against at least one of the belts causing the belts to press uniformly against at least one side of the panel, thereby flattening the molten solder deposits on the panel into a level plane.

* * * * *